United States Patent [19]
Witte

[11] Patent Number: 5,078,834
[45] Date of Patent: Jan. 7, 1992

[54] METHOD AND MEANS FOR DAMPING MODES OF PIEZOELECTRIC VIBRATORS

[75] Inventor: Robert S. Witte, Worth, Ill.

[73] Assignee: Motorola, Inc., Schaumburg, Ill.

[21] Appl. No.: 347,123

[22] Filed: May 4, 1989

Related U.S. Application Data

[62] Division of Ser. No. 163,916, Mar. 3, 1988.

[51] Int. Cl.[5] .............................................. H01L 41/00
[52] U.S. Cl. ................................. 156/656; 156/659.1; 156/663; 29/25.35; 427/100; 427/124; 204/192.17; 205/221
[58] Field of Search ...................... 156/656, 659.1, 663; 310/312, 321, 369, 370; 427/100, 124, 250, 255, 123; 204/192.17, 14.1, 32.1, 35.1, 45.1; 29/25.35

[56] References Cited
U.S. PATENT DOCUMENTS

| | | |
|---|---|---|
| 2,870,521 | 1/1959 | Rudnick .......................... 310/369 X |
| 3,332,122 | 7/1967 | Christian . |
| 3,336,487 | 8/1967 | Martyn et al. . |
| 3,697,788 | 10/1972 | Parker et al. . |
| 3,898,489 | 8/1975 | Grady et al. . |
| 4,191,906 | 3/1980 | Kogure ........................... 310/312 X |
| 4,361,778 | 10/1982 | Luff et al. . |
| 4,477,952 | 10/1984 | Crescenzi et al. ............... 427/100 X |
| 4,608,510 | 8/1986 | Dinger et al. ....................... 310/361 |

Primary Examiner—David A. Simmons
Assistant Examiner—Thi Dang
Attorney, Agent, or Firm—Timothy W. Markison; Joseph P. Krause; Steven G. Parmelee

[57] ABSTRACT

A method and arrangement for providing damping of undesired modes of piezoelectric vibrators is disclosed that eliminates the tedious and often inaccurate methods of known mass-loading techniques. Instead, the arrangement relies on physically altering a controlled amount of the piezoelectric material located at a predetermined point to effect the selective damping needed to minimize the undesired responses and to minimally interfere with the desired mode of operation.

11 Claims, 1 Drawing Sheet

METHOD AND MEANS FOR DAMPING MODES OF PIEZOELECTRIC VIBRATORS

This is a divisional of application Ser. No. 07/163,916, filed Mar. 3, 1988.

BACKGROUND OF THE INVENTION

The present invention relates generally to piezoelectric vibrators, and more particularly to an improved method and arrangement for damping unwanted modes or responses of a processed AT-cut quartz resonator.

Piezoelectric resonators, such as AT-cut quartz resonators, are subject to spurious modes of oscillation. The majority of such spurious responses may be attenuated by application of Bechmann's wave trapping criteria which relates the frequency of the unit, the electrode area, and tee amount of mass loading to provide optimum spurious response suppression. However, in some circumstances, strong spurious responses may still exist in piezoelectric resonators, even after the electrode area has been optimized using this technique.

Certain general techniques have also been developed that address the problems encountered when piezoelectric resonators produce significant anharmonic responses (that is, those responses clustered around the fundamental and overtones of the fundamental).

One known arrangement utilizes a scheme for providing spurious response damping by utilizing small dabs of epoxy affixed to the crystal in critical locations on the resonator blank. Such arrangements are both inaccurate and time consuming, particularly in a high volume factory production process.

Other known arrangements utilize an electrode pattern and additional pair of neutral metalized tabs, labeled pseudo tabs, spaced near the metal electrodes mounted on the two major surfaces of a quartz crystal. By so doing, the quartz crystal is mass loaded by the deposited thin film metalized psuedo tabs to alter the response pattern of the undesired anharmonic modes, so that damping can be effected at the outer ends of the crystal blank. Such arrangements require large pseudo tabs because damping must be done at the outer ends only.

Accordingly, there exists a need for an improved method and arrangement for accurately fabricating piezoelectric resonators, such as quartz crystal blanks, in which the optimized electrode pattern has an electrode area and significantly smaller electrode tab so that the placement of a prescribed amount of mode damping can be placed anywhere on the crystal blank in a consistent and accurate manner.

SUMMARY OF THE INVENTION

It is an object of the present invention to provide an improved method and arrangement for damping modes of piezoelectric vibrators that overcomes the foregoing deficiencies.

It is a further object of the present invention to provide an improved method and arrangement for damping modes of piezoelectric vibrators of the foregoing type, that is particularly suited for single ended mounting and that avoids the use of additional mass.

One embodiment contemplates a piezoelectric resonator having undesired vibration modes damped with minimal interference to a desired mode of operation, the resonator comprising:

a) a piezoelectric material having two major surfaces, a surrounding edge, and a given quality factor (Q);

b) an electrode pattern, positioned to cover a portion of each of the major surfaces of the piezoelectric material, the electrode patterns being approximately coextensive and directly opposite and providing a desired mode as well as undesired modes upon proper energization thereof; and c) at least one major surface of said piezoelectric material having a relatively small opening located at a predetermined point thereon, the piezoelectric material having a pocket beneath the opening so that a controlled reduction in the Q ensures damping of at least one undesired mode.

DETAILED DESCRIPTION OF THE PREFERRED EMBODIMENT

Figure 1:
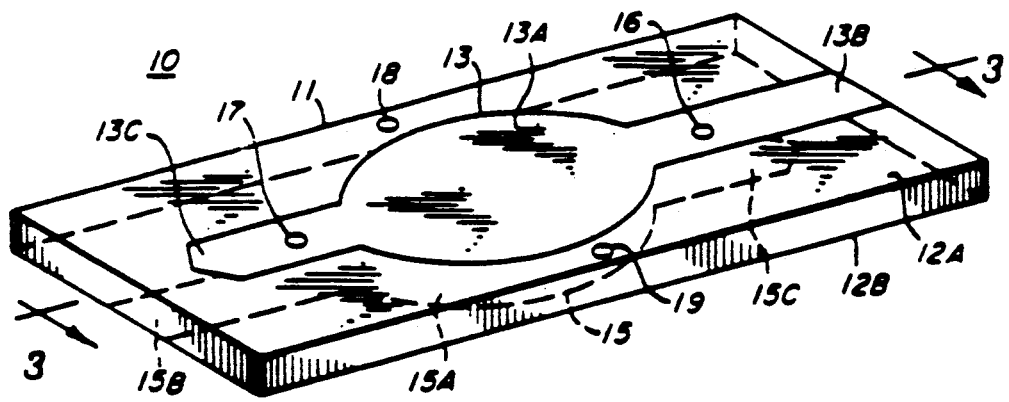
FIG. 1 is a perspective view of a crystal blank embodying the present invention.

FIG. 1 depicts at 10 a piezoelectric resonator that includes a substantially rectangular quartz crystal blank (11) having two major surfaces (12A and 12B). An electrical conductor is affixed via evaporative deposition, sputtering deposition, or electroplating processes to a major surface (12A), and a portion of this conductor forms an electrode pattern (13). This electrode pattern (13) includes an electrode area portion (13A) and at least one electrode tab portion (13B and 13C). In like manner, an electrode pattern (15) is affixed to the other major surface (12B) of the piezoelectric material, so that the two electrode patterns (13 and 15) are approximately coextensive and directly opposite one another. This orientation provides a desired mode of vibration as well as one or more undesired modes of vibration of the piezoelectric material on proper energization of these electrode patterns.

Also shown in FIG. 1 are several relatively small openings, in this case depicted as holes (16, 17, 18, and 19), appearing on the first major surface (12A) of the crystal blank (11). As will be discussed in a moment, any combination of one or more of these holes (16, 17, 18, and 19) can be utilized to effect damping of one or more undesired modes of vibration with minimal interference to a desired mode of operation.

The other electrode pattern (15) affixed to the other major surface (12B) includes an electrode area (15A) and two electrode tabs (15B and 15C). However, this surface (12B) may or may not include one or more relatively small openings therein, depending upon the particular application. If they are included, they should be located to ensure that none of the openings extend all the way through the crystal blank.

Figure 2:
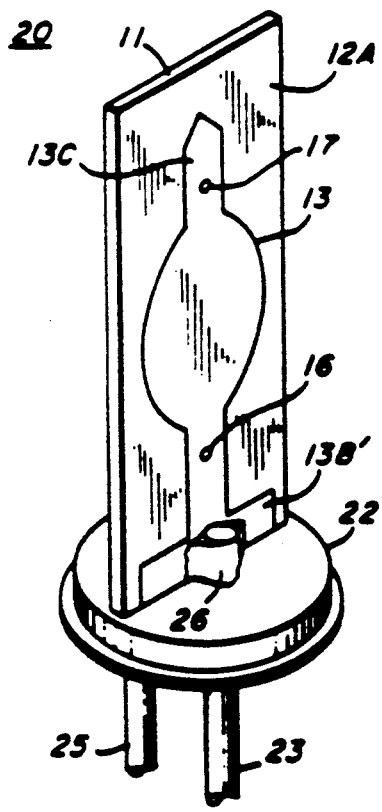
FIG. 2 is one arrangement for single-ended cantilevered mounting of the crystal blank of FIG. 1.

FIG. 2 depicts at 20 a single-ended mounting (or cantilevered mounting) of the crystal blank (11). This arrangement is particularly significant for single-ended mounted crystal blanks, which have only one end of lossy material for anharmonic mode damping. As shown, the crystal blank (11) includes two holes (16 and 17) within the electrode pattern (13) positioned on the first major surface (12A). This electrode pattern (13) also includes a modified electrode tab portion (13B')

that facilitates electrical connection to terminals on a mounting base (22).

In general, for an application having an AT-cut quartz crystal (11) in which the fundamental mode is the desired mode, the electrode pattern (13) is configured so that the closest undesired mode exists within the piezoelectric material in a region where the fundamental thickness-shear mode is negligible. Then, points within this region are identified where at least one undesired mode is still significant. Each such point represents a node for the fundamental response, and a non-nodal point for at least one undesired response. Then, by physically altering the crystal at such points, the undesired mode is successfully damped with minimal effect on the Q (or quality factor) of the desired, fundamental thickness-shear mode. This factor Q is defined generally for any vibrator device (or circuit) at resonance as the amount of energy stored in the vibrator (or circuit) divided by the amount of energy dissipated per cycle. This physical alteration to the crystal can be effected by various methods, including chemical etching, laser techniques, or ultrasonic drilling.

Specifically, in the exemplary embodiment given in FIG. 2, two holes (16 and 17) are provided in the electrode tabs (13B' and 13C), respectively, at approximate mid-way points along their respective lengths. For this case, the desired mode is the fundamental mode, and the undesired mode is the anharmonic 1,3,1, (y,x,z) mode. Therefore, these holes (16 and 17) are located at points representing nodes of the fundamental thickness-shear mode and at non-nodal points of the undesired mode of the quartz crystal resonator. In particular, these holes (16 and 17) are located at a non-nodal point corresponding to the undesired anharmonic 1,3,1 mode, which is most significant in that it is both the most responsive of the anharmonics and the closest to the fundamental thickness-shear response mode.

As shown, the crystal blank (11) is attached along one surrounding edge to a base (22) having two active leads (23 and 25). One lead (23) electrically connects to one electrode tab (13B') by means of solder or conductive epoxy (26), while the other active lead (25) connects to the other electrode tab (13C) by suitable means, including a conductive jumper or bondwire.

Figure 3:
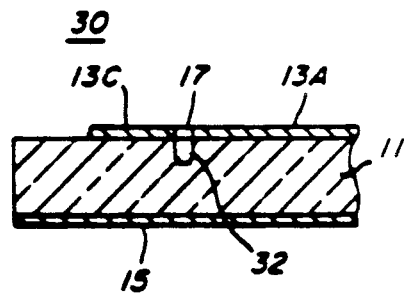
FIG. 3 is a cross-sectional view of the crystal blank of FIG. 1.

FIG. 3 depicts at 30 a cross-sectional view of a portion of the crystal blank (11) embodying the present invention. Included within the first electrode pattern (13), approximately half-way along the length of the electrode tab (13C), is an opening (17), sized so that a localized pocket of damaged quartz is effected, whether removed by chemical etching or altered in structure by laser techniques. For chemical etching, the opening has a diameter of approximately 1 to 2 mils, or $7.8 \times 10^{-6}$ meters, and locates a pocket (32) directly beneath the opening (17) of about one-third the thickness of the crystal blank.

This pocket (17) represents the altered portion of the crystal, and effects a controlled reduction in the Q of the piezoelectric material to thereby alter the crystal properties, particularly for vibration modes having a non-nodal point having negligible displacement response at that location. Keep in mind, however, that the location corresponds to a node (or zero) response of the fundamental thickness-shear mode, and hence the fundamental mode is virtually unaffected by the modification to the quartz.

The pocket (32) located within the crystal blank (11) may be formed by any of various means, including a photolithographic and chemical etching process. The photolithographic process allows accurate placement of the location of one or more holes in at least one surface of the crystal blank. Then, when the quartz crystal is processed in a quartz etchant, a pocket (32) is formed to a desired depth as a function of the size of the hole. It has been determined that the optimum depth of this pocket is about one-third thickness of the piezoelectric material. Such a method for damping undesired vibration modes of a piezoelectric material, having a given quality factor Q, with minimal interference to the desired mode of operation comprises the steps of:

a) plating an electrical conductor onto each of two major surfaces of the piezoelectric material;
b) defining a blank outline in each electrical conductor to include at least one electrode pattern, with a portion of the electrical conductor having a relatively small opening located at a predetermined point thereon;
c) etching portions of the electrical conductor to reveal the blank outline and the portion having the small hole;
d) etching portions of the piezoelectric material to define the blank outline and to form the small hole therein; and
e) final etching the electrical conductor to define the electrode and electrode tab configuration. This method and arrangement can therefore be applied to any piezoelectric vibrator, keeping in mind that the shape of the opening will determine to what depth the pocket is formed without going all the way through the piezoelectric material.

Furthermore, for piezoelectric resonators such as AT-cut quartz crystals, the locations of the fundamental and anharmonic modes (as well as the harmonic modes) are able to be predicted utilizing well-known techniques. Hence, given a known electrode area and electrode tab configuration, locating points where desired response nodes and non-nodal responses of undesired modes exist can be determined with relative ease. Then, a suitable opening (and the resultant depth for the pocket therebeneath) can be determined experimentally without great difficulty to form the pocket and effect a controlled reduction in the Q of the material.

A significant feature of the present invention is that the method eliminates tedious, inaccurate manual processes and allows for photolithographic processes to be utilized for accurately locating and effecting the amount of controlled reduction in the Q of the piezoelectric resonator. As a result, the present invention overcomes the distinct disadvantages of the known art. That is, the present arrangement provides a way in which to introduce loss mechanisms, or selective damping, without relying on additional mass or mounting schemes that require large electrode tabs, by controlling the reduction in the Q for one or more locations on the resonator. The present invention is particularly well-suited for crystal blanks mounted, or held fixed, at only a single end. However, it is also suitable for damping unwanted resonances for double-ended mounting schemes (not shown, but easily inferred from FIG. 2) in which two opposing ends of the crystal blank are held fixed.

As a result, there has been described a method and means for providing selective damping of undesired modes in piezoelectric vibrators which is suitable for use in high volume production. Utilizing photolithographic processes to eliminate tedious and inaccurate techniques which rely upon adding matter to mass-load the piezoelectric material, selective damping of undesired modes is achieved while minimizing interference with a desired mode. Thus, the above-described method and arrangement is able to overcome the limitations of the known art.

I claim:

1. A method for producing a piezoelectric vibrator comprising the steps of:
   (a) plating an electrical conductor onto at least one surface of a piezoelectric material to produce a deposited electrical conductor;
   (b) etching the deposited electrical conductor to reveal a blank outline of the piezoelectric vibrator and to form at least one opening in the deposited electrical conductor;
   (c) etching the piezoelectric material per the blank outline to define the piezoelectric vibrator blank and to form at least one pocket in the piezoelectric material that is co-extensive with the at least one opening; and
   (d) etching the deposited electrical conductor to define an electrode and an electrode tab, such that the at least one pocket causes dampening of undesired harmonic modes and undesired anharmonic modes with negligible effects on a desired harmonic mode.

2. The method according to claim 1, wherein step (a) comprises plating the electrical conductor onto the at least one surface of the piezoelectric material by a sputter deposition process.

3. The method according to claim 1, wherein step (a) comprises plating the electrical conductor onto the at least one surface of the piezoelectric material by an evaporative deposition process.

4. The method according to claim 1, wherein step (a) comprises plating the electrical conductor onto the at least one surface of the piezoelectric material by an electroplating process.

5. The method according to claim 1, wherein step (b) comprises etching portions of the electrical conductor utilizing a chemical etching process.

6. The method according to claim 1, wherein step (b) comprises etching portions of the electrical conductor to reveal at least one electrode pattern having at least one hole with a diameter approximately equal to one-half the thickness of the piezoelectric material.

7. The method according to claim 1, wherein step (b) comprises etching portions of the electrical conductor to include at least one hole comprises etching a hole with a diameter of about $7.8 \times 10^{-6}$ meters.

8. The method according to claim 1, wherein step (c) comprises chemically etching undesired portions of the piezoelectric material left uncovered by the electrical conductor.

9. The method according to claim 1, wherein step (c) comprises etching portions of the piezoelectric material beneath each opening to approximately one-third thickness of said piezoelectric material, to achieve controlled reduction in the Q for at least one undesired mode.

10. The method according to claim 1, wherein step (d) comprises etching the electrical conductor to include said opening within the electrode tab configuration.

11. The method according to claim 1, wherein step (d) comprises etching the electrical conductor to exclude said opening from the electrode tab configuration.

* * * * *